United States Patent
Lee et al.

(10) Patent No.: US 10,720,900 B2
(45) Date of Patent: Jul. 21, 2020

(54) ACOUSTIC RESONATOR AND METHOD

(71) Applicant: SAMSUNG ELECTRO-MECHANICS CO., LTD., Suwon-si (KR)

(72) Inventors: Tae Hun Lee, Suwon-si (KR); Won Han, Suwon-si (KR); Moon Chul Lee, Suwon-si (KR); Sung Han, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 575 days.

(21) Appl. No.: 15/391,353

(22) Filed: Dec. 27, 2016

(65) Prior Publication Data

US 2018/0013401 A1     Jan. 11, 2018

(30) Foreign Application Priority Data

Jul. 7, 2016     (KR) .................... 10-2016-0086007
Aug. 11, 2016   (KR) .................... 10-2016-0102481

(51) Int. Cl.
*H03H 9/02*     (2006.01)
*H03H 9/17*     (2006.01)
*H03H 3/007*    (2006.01)
*H03H 9/54*     (2006.01)
*H03H 3/02*     (2006.01)

(52) U.S. Cl.
CPC .......... *H03H 9/173* (2013.01); *H03H 3/0077* (2013.01); *H03H 9/02015* (2013.01); *H03H 9/02023* (2013.01); *H03H 9/54* (2013.01); *H03H 2003/021* (2013.01)

(58) Field of Classification Search
CPC .............. H03H 9/173; H03H 9/02015; H03H 9/02023; H03H 3/0077
USPC ................................................... 310/322, 324
See application file for complete search history.

(56) References Cited

U.S. PATENT DOCUMENTS

| | | | |
|---|---|---|---|
| 6,313,563 | B1 | 11/2001 | Kadota et al. |
| 2010/0033063 | A1 | 2/2010 | Nishihara et al. |
| 2012/0218060 | A1 | 8/2012 | Burak et al. |

(Continued)

FOREIGN PATENT DOCUMENTS

| | | |
|---|---|---|
| CN | 1364339 A | 8/2002 |
| JP | 2007-295307 A | 11/2007 |

(Continued)

OTHER PUBLICATIONS

Japanese Office Action dated Mar. 6, 2018 in corresponding Japanese Patent Application No. 2017-002172 (12 pages in English and 4 pages in Japanese).

(Continued)

*Primary Examiner* — Derek J Rosenau
(74) *Attorney, Agent, or Firm* — NSIP Law

(57) ABSTRACT

An acoustic resonator including a substrate, an active vibration region including, sequentially stacked on the substrate, a lower electrode, a piezoelectric layer, and an upper electrode, and a horizontal resonance suppressing part formed from and disposed in the piezoelectric layer, the horizontal resonance suppressing part having piezoelectric physical properties that are different from piezoelectric physical properties of the piezoelectric layer.

21 Claims, 9 Drawing Sheets

(56) References Cited

U.S. PATENT DOCUMENTS

| 2012/0319530 A1* | 12/2012 | Burak | H03H 9/173 |
| | | | 310/321 |
| 2014/0225683 A1* | 8/2014 | Burak | H03H 9/173 |
| | | | 333/187 |
| 2015/0171826 A1 | 6/2015 | Sakashita et al. | |
| 2015/0207490 A1 | 7/2015 | Taniguchi et al. | |

FOREIGN PATENT DOCUMENTS

| JP | 2010-45437 A | 2/2010 |
| JP | 5136635 B2 | 11/2012 |
| JP | 2013-5446 A | 1/2013 |
| JP | 2015-119249 A | 6/2015 |
| JP | 2015-139167 A | 7/2015 |
| KR | 10-2000-0077005 A | 12/2000 |
| KR | 10-0906679 B1 | 7/2009 |
| WO | WO 01/06647 A1 | 1/2001 |
| WO | WO 2011/048910 A1 | 4/2011 |

OTHER PUBLICATIONS

Chinese Office Action dated Feb. 18, 2020 issued in the corresponding Chinese Patent Application No. 201710059879.0 (17 pages in English, 13 pages in Chinese).

* cited by examiner

ACOUSTIC RESONATOR AND METHOD

CROSS-REFERENCE TO RELATED APPLICATIONS

This application claims benefit of priority to Korean Patent Application Nos. 10-2016-0086007 and 10-2016-0102481 respectively filed on Jul. 7, 2016 and Aug. 11, 2016 in the Korean Intellectual Property Office, the disclosures of which are incorporated herein by reference in their entirety for all purposes.

BACKGROUND

1. Field

The present disclosure relates to an acoustic resonator and method.

2. Description of Related Art

With the miniaturization of wireless communications devices, there may be an increased desire in miniaturization of high frequency component technologies. As an example, a bulk acoustic wave (BAW) resonator type filter using semiconductor thin film wafer manufacturing technology has been used for such miniaturized high frequency components.

The bulk acoustic wave (BAW) resonator refers to a thin film type element generating resonance using piezoelectric characteristics of a piezoelectric dielectric material deposited on a silicon wafer, a semiconductor substrate, for example. The BAW may also be implemented as a filter, for example.

As only examples, the bulk acoustic wave (BAW) resonators may be used in various fields such as those of small, light filters, oscillators, resonance elements, acoustic resonance mass sensors, and the like, of mobile communications devices, chemical and biological devices, and the like.

SUMMARY

This Summary is provided to introduce a selection of concepts in a simplified form that are further described below in the Detailed Description. This Summary is not intended to identify key features or essential features of the claimed subject matter, nor is the Summary intended to be used as an aid in determining the scope of the claimed subject matter.

In one general aspect, an acoustic resonator includes a substrate, an active vibration region including, sequentially stacked on the substrate, a lower electrode, a piezoelectric layer, and an upper electrode, and a horizontal resonance suppressing part formed from and disposed in the piezoelectric layer, the horizontal resonance suppressing part having piezoelectric physical properties that are different from piezoelectric physical properties of the piezoelectric layer.

In an example aspect, only a portion or an entirety of the horizontal resonance suppressing part may be disposed in the active vibration region.

A surface area of an upper surface of the horizontal resonance suppressing part disposed in the active vibration region may be 50% or less than 50% of an entire surface area of an upper surface of the active vibration region.

The horizontal resonance suppressing part may be disposed along an edge of the active vibration region.

The horizontal resonance suppressing part may include a first horizontal resonance suppressing part having a first thickness and a second horizontal resonance suppressing part having a different second thicknesses.

The first horizontal resonance suppressing part and the second horizontal resonance suppressing part may respectively include injected ions in piezoelectric material of the piezoelectric layer so that the first horizontal resonance suppressing part and the second horizontal resonance suppressing part have respective piezoelectric physical properties different from the piezoelectric physical properties of the piezoelectric layer.

The first horizontal resonance suppressing part and the second horizontal resonance suppressing part may be formed to have the same piezoelectric physical properties.

The first horizontal resonance suppressing part and the second horizontal resonance suppressing part may respectively include injected ions in piezoelectric material of the piezoelectric layer so that the first horizontal resonance suppressing part and the second horizontal resonance suppressing part have respective piezoelectric physical properties different from the piezoelectric physical properties of the piezoelectric layer.

The horizontal resonance suppressing part may be formed so as to have different thicknesses that increase in thickness toward an edge of the active vibration region.

The horizontal resonance suppressing part may include injected ions in piezoelectric material of the piezoelectric layer so the piezoelectric physical properties of the horizontal resonance suppressing part are different from the piezoelectric physical properties of the piezoelectric layer.

The horizontal resonance suppressing part may be formed to have a same thickness as the piezoelectric layer.

The horizontal resonance suppressing part may include injected ions in piezoelectric material of the piezoelectric layer so the piezoelectric physical properties of the horizontal resonance suppressing part are different from the piezoelectric physical properties of the piezoelectric layer.

The horizontal resonance suppressing part may be formed to have a thickness equal to half or less than half of a thickness of the piezoelectric layer.

The horizontal resonance suppressing part may include injected ions in piezoelectric material of the piezoelectric layer so the piezoelectric physical properties of the horizontal resonance suppressing part are different from the piezoelectric physical properties of the piezoelectric layer.

The horizontal resonance suppressing part may be formed only within, and at an edge of, the active vibration region.

The horizontal resonance suppressing part may have a piezoelectric performance that is lower than a piezoelectric performance of the piezoelectric layer.

The horizontal resonance suppressing part may have a piezoelectric performance higher than a piezoelectric performance of the piezoelectric layer.

The horizontal resonance suppressing part may have a piezoelectric performance lower than a piezoelectric performance of the piezoelectric layer.

In one general aspect an acoustic resonator method includes sequentially forming a lower electrode and a piezoelectric layer on a substrate, forming a horizontal resonance suppressing part in the piezoelectric layer by injecting ions into a select portion of the piezoelectric layer so the horizontal resonance suppressing part has piezoelectric physical properties that are different from piezoelectric physical properties of the piezoelectric layer, and completing an active vibration region of the acoustic resonator by forming an upper electrode on the piezoelectric layer and the horizontal resonance suppressing part.

The method may further include forming an air gap between the substrate and the lower electrode.

In an example aspect, only a portion or an entirety of the horizontal resonance suppressing part may be formed in the active vibration region.

The forming of the horizontal resonance suppressing part may include forming a first horizontal resonance suppressing part having a first thickness and a second horizontal resonance suppressing part having a different second thicknesses, the first horizontal resonance suppressing part and the second horizontal resonance suppressing part having piezoelectric physical properties that are different or same.

The forming of the horizontal resonance suppressing part may include injecting ions of any one of Sc, Mg, Nb, Zr, and Hf into the select portion of the piezoelectric layer formed of AlN to replace some of the Al in the select portion of the piezoelectric layer with the ions.

The forming of the horizontal resonance suppressing part may include injecting ions of any one of Ar, oxygen, B, P, and N into the select portion of the piezoelectric layer formed of AlN to destroy lattice structures of the select portion of the piezoelectric layer.

In one general aspect an acoustic resonator includes a substrate, a resonance unit, including: a lower electrode; a piezoelectric layer formed of piezoelectric material; a horizontal resonance suppressing part formed of the piezoelectric material with injected ions; and an upper electrode, and the acoustic resonator further includes an air gap below the resonance unit, where the horizontal resonance suppressing part has piezoelectric physical properties different from piezoelectric physical properties of the piezoelectric layer.

The acoustic resonator may further include a frame having a ringed shape on the upper electrode and only outside of an active vibration region of the resonance unit.

The horizontal resonance suppressing part may have a ringed shape along an outer edge of the piezoelectric layer and at least partially within an active vibration region of the resonance unit.

The injected ions may include an ion of any one of Sc, Mg, Nb, Zr, Hf, Ar, O, B, P, and N.

Other features and aspects will be apparent from the following detailed description, the drawings, and the claims.

BRIEF DESCRIPTION OF DRAWINGS

The above and other aspects, features, and advantages of the present disclosure will be more clearly understood from the following detailed description taken in conjunction with the accompanying drawings, in which.

Throughout the drawings and the detailed description, the same reference numerals refer to the same or like elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Figure 1:
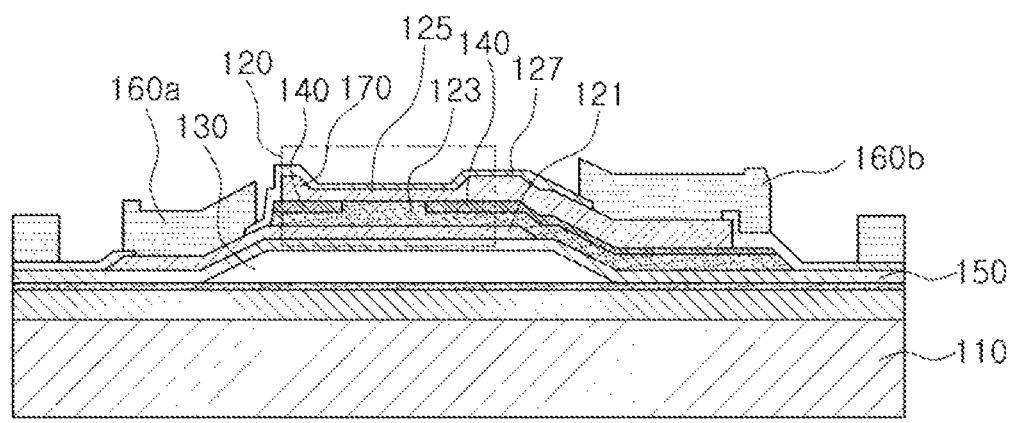
FIG. 1 is a cross-sectional view schematically illustrating an acoustic resonator according to one or more embodiments.
Figure 2:
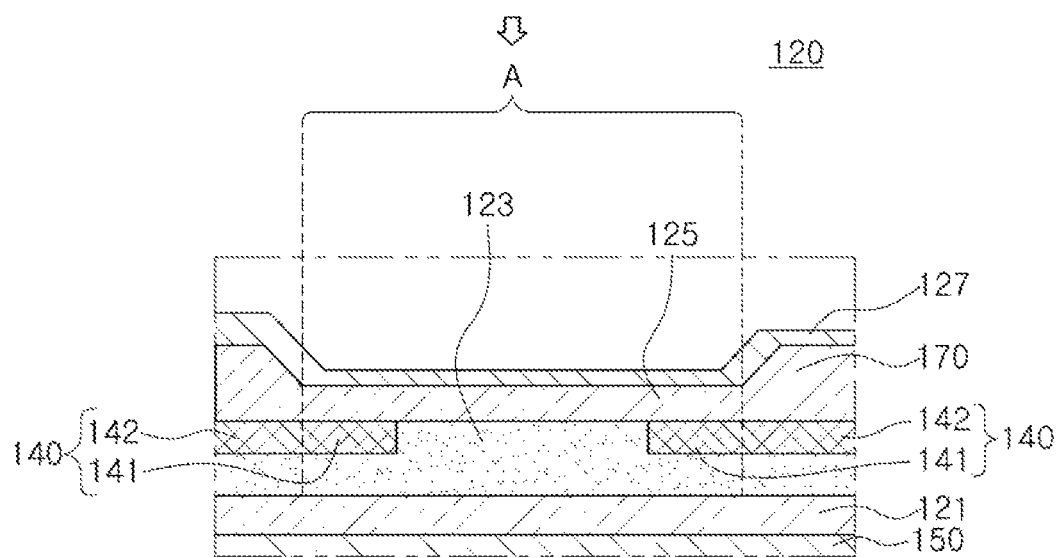
FIG. 2 is an enlarged cross-sectional view of a resonance part of the acoustic resonator of FIG. 1, according to one or more embodiments.

FIG. 1 is a cross-sectional view schematically illustrating an acoustic resonator, according to one or more embodiments, and FIG. 2 is an enlarged cross-sectional view of a resonance part or portion, i.e., resonance unit, of the acoustic resonator of FIG. 1.

Referring to FIGS. 1 and 2, an acoustic resonator 100 according to one or more embodiments may include a substrate 110 and a resonance part 120.

An air gap 130 may be formed so as to be between the substrate 110 and the resonance part 120, and the resonance part 120 may be formed so as to be above a membrane layer 150 and spaced from the substrate 110 by the air gap 130. As only an example, the air gap 130 may be formed after formation of the membrane layer 150 and resonance part 120, such as by removal of a sacrificial layer that is formed on the substrate 110 and on which the membrane layer 150 is formed. In such an example, after removal of the sacrificial layer the air gap 130 may remain and the membrane layer 150 may provide support for the layers of the resonance part 120 that are above the air gap 130.

The substrate 110 may be a silicon substrate or a silicon-on-insulator (SOI) type substrate. However, the substrate 110 is not limited thereto, but may be various substrates, such as a glass substrate, and the like, as only examples.

The resonance part 120 may include a lower electrode 121, a piezoelectric layer 123, and an upper electrode 125. For example, the resonance part 120 may be formed by sequentially stacking the lower electrode 121, the piezoelectric layer 123, and the upper electrode 125, beginning with the lower electrode 121. Therefore, the piezoelectric layer 123 may be disposed between the lower electrode 121 and the upper electrode 125.

Since the resonance part 120 is formed above the membrane layer 150, the membrane layer 150, the lower electrode 121, the piezoelectric layer 123, and the upper electrode 125 may be sequentially stacked above the substrate 110, for example.

The resonance part 120 may resonate the piezoelectric layer 123 depending on signals applied to the lower electrode 121 and the upper electrode 125 to generate a resonance frequency and an anti-resonance frequency based on a piezoelectric phenomenon induced in the piezoelectric layer that allows the resonance part 120 to vibrate in a predetermined direction. Resultantly, bulk acoustic waves may be generated in the same direction as the direction in which the resonance part 120 vibrates, thereby generating resonance.

As only non-limiting examples, the lower electrode 121 and the upper electrode 125 may be formed using a metal such as gold (Au), molybdenum (Mo), ruthenium (Ru), aluminum (Al), platinum (Pt), titanium (Ti), tungsten (W), palladium (Pd), chromium (Cr), nickel (Ni), or the like, as only examples, as a main material. In an embodiment, as only an example, both of the lower electrode 121 and the upper electrode 125 may be formed of molybdenum (Mo).

As noted above, the resonance part 120 may use acoustic waves of the piezoelectric layer 123. For example, depending on the signals that are applied to the lower electrode 121 and the upper electrode 125, differing mechanical vibrations may be generated in a thickness direction of the piezoelectric layer 123, e.g., such that acoustic waves may be generated.

Here, zinc oxide (ZnO), aluminum nitride (AlN), quartz, or the like, as only examples, may be used as a material of the piezoelectric layer 123.

The resonance phenomenon of the piezoelectric layer 123 may be generated when a half of a wavelength of the applied signal coincides with a thickness of the piezoelectric layer 123. When the resonance phenomenon is generated, electrical impedance may be rapidly changed from when the resonance phenomenon is not generated. Therefore, such an acoustic resonator according to one or more embodiments may be used in/as a filter that may operate according to a select frequency or band of frequencies, such as for passing select frequencies of electrical energy and acting as a high impedance to other frequencies.

The resonance part 120 may be disposed to be spaced apart from the substrate 110 by the air gap 130 in order to improve a quality factor of the acoustic resonator 100.

For example, reflection characteristics of the acoustic wave generated in the resonance part 120 may be improved because of the air gap 130. Since the air gap 130 is an empty space the air gap 130 may have an impedance close to infinity, e.g., the impedance of air, so the acoustic wave may remain or be contained in the resonance part 120, without being externally lost from the resonance part 120.

In addition, in one or more embodiments, a frame 170 may be disposed above the upper electrode 125.

In an embodiment, the frame 170 is formed in a ring shape, i.e., from an above perspective in the direction of the illustrated arrow of FIG. 2, along a contour of the resonance part 120 on the upper electrode 125. In such an example, the resonance part 120 may be formed to have a rounded contour or multi-sided contour.

Substantial bulk acoustic wave vibrations of the resonance part 120 may be generated in an active vibration region A (see FIG. 2) of which an overall shape may be defined by an inner wall of the frame 170. Here, the active vibration region A refers to a region of the resonance part 120 positioned with respect to the frame 170 when viewing the resonance part 120 from the above perspective, i.e., in the illustrated arrow direction of FIG. 2. The active vibration region A may also be considered a region that the acoustic resonator 100 generates resonance. Areas beyond the active vibration region A, e.g., along the illustrated lateral sides of the active vibration region A, may be considered inactive regions and may not generate resonance as desired.

The frame 170 may affect the structure of the resonance part 120 so as to reflect horizontal elastic waves moving toward the outside of the resonance part 120 from among horizontal elastic waves generated in the active vibration region A within the resonance part 120, to prevent energy loss of the elastic waves. Therefore, such an acoustic resonator according to one or more embodiments may help secure a high Q-factor and high electromechanical coupling coefficient $k_t^2$. Here, the electromechanical coupling coefficient $k_t^2$ may represent a ratio of mechanical energy out to electrical energy in to the acoustic resonator 100.

A high Q-factor may increase blocking characteristics of frequency bands distinguished from the resonance frequency of the acoustic resonator 100, e.g., for use in implementing a filter or a duplexer embodiment. A high $k_t^2$ may help secure a bandwidth to increase a data rate and a speed at the time of transmitting and receiving data for such a filter or duplexer embodiment.

A plane of the active vibration region A, e.g., as viewed from the above perspective, may have a polygonal shape or an oval or rounded shape, with the contour, e.g., an inner contour, of the frame 170 having a correspondingly similar polygonal or oval or rounded ring shape, for example.

The frame 170 may be formed of a piezoelectric material, a dielectric material, or a metal. As only non-limiting examples, the frame 170 may be formed of one selected from the group consisting of aluminum nitride (AlN), lead zirconate titanate (PZT), silicon oxide ($SiO_2$), titanium oxide ($TiO_2$), ruthenium (Ru), molybdenum (Mo), gold (Au), titanium (Ti), copper (Cu), tungsten (W), and aluminum (Al) or a composite material including any one of selected from the group consisting of aluminum nitride (AlN), lead zirconate titanate (PZT), silicon oxide ($SiO_2$), titanium oxide ($TiO_2$), ruthenium (Ru), molybdenum (Mo), gold (Au), titanium (Ti), copper (Cu), tungsten (W), and aluminum (Al) as a main component. Alternatively, the frame 170 may be made of other materials.

In one or more embodiments, as only an example, the frame 170 may be formed by forming a frame layer on the upper electrode 125 through sputtering or deposition. The forming of the frame 170 may further include removing portions of the sputtered or deposited frame layer by an etching or lift-off process, again as only examples, such as to remove unnecessary portions of the frame 170 that are not needed for, do not substantially further enhance the desired horizontal elastic wave reflection for the acoustic resonator 100, or for accessing below layers, for example.

In an example, the frame 170 may be formed of the same material as that of the upper electrode 125, and may be additionally formed in the same process of forming the upper electrode 125.

In addition, in such an acoustic resonator, according to one or more embodiments, a horizontal resonance suppressing part 140 may be disposed in the piezoelectric layer 123 in order to suppress excess vibrations, which are vibrations unnecessary for, or detrimental to, resonance of the resonance part 120 or vibrations that reduce Q-factor or $k_t^2$.

In an example, the horizontal resonance suppressing part 140 may be formed by injecting impurities into select regions or areas of the piezoelectric layer 123. The resulting horizontal resonance suppressing part 140 may have changed physical properties (such as stiffness, a piezoelectric constant, or the like) of a desired region within the piezoelectric layer 123 from the physical properties of the piezoelectric layer 123. With the inclusion of the horizontal resonance suppressing part 140, lateral waves generated in the resonance part 120 may be more effectively limited to significantly decrease generation of noise (for example, lateral wave noise) due to lateral wave resonance.

The horizontal resonance suppressing part 140 may be formed to have various depths and various shapes, such as by changing a type of injected ions, energy applied at the time of injecting ions into the piezoelectric layer 123, a dose of ions, a heat treatment temperature and time, and/or the like, as only examples.

In an example in which the piezoelectric layer 123 is formed of AlN, the horizontal resonance suppressing part 140 may be formed by injecting ions of Sc, Mg, Nb, Zr, Hf, or the like, as only examples, into select regions or areas of the piezoelectric layer 123. For example, the injected ions may replace some Al of the piezoelectric layer 123 within an area/region of the piezoelectric layer 123 corresponding to the horizontal resonance suppressing part 140 to change physical properties of the corresponding area/region of the piezoelectric layer 120. With the forming of the horizontal resonance suppressing part 140 in such select regions/areas of the piezoelectric layer 123, piezoelectric performance of the select regions/areas of the piezoelectric layer 123 may be improved as compared to other portions of the piezoelectric layer 123 where such ions are not injected.

In addition, the horizontal resonance suppressing part 140 may also be formed by intentionally destroying a lattice structure of the piezoelectric layer 123 in a select region/area of the piezoelectric layer 123, such as by injecting ions of Ar, oxygen, B, P, N, or the like, as only examples, into this select region/area of the piezoelectric layer 123. In this case, the injected ions may destroy some connection structures between Al and N to change physical properties of this select region/area of the piezoelectric layer 123. With the forming of the horizontal resonance suppressing part 140 through the ion injection into such select regions/areas of the piezoelectric layer 123, piezoelectric performance of the horizontal resonance suppressing part 140 may be deteriorated as compared to other portions of the piezoelectric layer 123 where such ions are not injected.

The horizontal resonance suppressing part 140 may be formed in the piezoelectric layer 123, and a portion or the entirety of the horizontal resonance suppressing part 140 may be disposed in the active vibration region A. The horizontal resonance suppressing part 140, according to one or more embodiments, may also be divided into different parts whose physical properties are respectively modified from the piezoelectric layer 123, such as a first region 141 disposed in the active vibration region A and a second region 142 disposed in the inactive vibration region, e.g., below and outside the frame 170, outside of the vibration active area A. As illustrated in FIG. 2, as well as in FIGS. 4, 6, and 8, as only examples, the horizontal resonance suppressing part 140 may be formed symmetrically, for example, symmetrical around a centerline of the resonance part 120. For example, similar to the ringed shape of the frame 170 from the above perspective, the horizontal resonance suppressing part 140 may also be formed in a ringed shape, as only an example, with FIGS. 2, 4, 6, and 8 illustrating the cross-section of such a ringed shape horizontal resonance suppressing part 140.

In this non-limiting example with multiple regions of the horizontal resonance suppressing part 140, the first region 141 may be disposed at a predetermined width (for example, 5 μm) along an edge or contour of the active vibration region A and within the active vibration region A. Here, the edge or contour of the active vibration region A may vertically, as illustrated, align with the illustrated boundary between the upper electrode 125 and the frame 170, such as where an inner contour of the frame 170 begins, or horizontal wave impedance effects from the frame 170 begin, as only examples.

Meanwhile, in this example, while the first region 141 is discussed as being continuously formed along the edge of the active vibration region A, the first region 141 is not limited thereto, but may also be partially or discontinuously formed along the edge of the active vibration region A, in differing embodiments. In addition, in alternate embodiments the first region 141 may not be formed in the example ringed or discontinuous ringed shape, and only formed along select sides or portions of the edge of the active vibration region A. Though the second region 142 will be discussed in more detail further below, it is also noted that the second region 142 may be formed in any of such shapes and have a similar shape as the first region 141 or a different shape or continuous/discontinuous form from the first region 141.

A surface area of an upper surface of the first region 141 disposed in the active vibration region A may be 50% or less of an entire surface area of an upper surface of the active vibration region A of the resonance part 120, or at least less than the entire surface area of the upper surface of the active vibration region A of the resonance part 120, as only examples.

In order to implement the changing of the physical properties of the piezoelectric layer 123 through injection of ions to form the horizontal resonance suppressing part 140, the horizontal resonance suppressing part 140 may need to be formed at a thickness of 0.05 μm or more. Therefore, a minimum thickness of the horizontal resonance suppressing part 140, or a minimum depth into an entire depth of the piezoelectric layer 123 to which ions are injected, according one or more embodiments, may be defined as 0.05 μm. In addition, a maximum thickness of the horizontal resonance suppressing part 140 may be the same as a thickness of the piezoelectric layer 123, e.g., where ions are injected into the entire depth of the piezoelectric layer 123 when forming the horizontal resonance suppressing part 140.

In an example embodiment, such as illustrated in FIG. 2, a thickness of the horizontal resonance suppressing part 140 may be greater than 0.05 μm and equal to half or less of the thickness of the piezoelectric layer 123. The present disclosure is not limited to the abovementioned configurations, and includes various modifications of the same.

The resonance part 120 may further include a protecting layer 127. The protecting layer 127 may be formed on or above the frame 170, the lower electrode 121, the upper electrode, and the piezoelectric layer 123 so as to prevent the frame 170, the lower electrode 121, the upper electrode, and the piezoelectric layer 123 from being exposed to an external environment, for example.

Meanwhile, during formation of the acoustic resonator 100, select portions of the lower electrode 121 and the upper electrode 125 may be exposed to the outside of the protecting layer 127, or the protecting layer 127 formed so as to not cover such select portions, and a first connection electrode 160a and a second connection electrode 160b formed on the select portions, respectively. The first connection electrode 160a and the second connection electrode 160b may be for exterior signal connections.

The first connection electrode 160a and the second connection electrode 160b may also be provided in order to confirm or finalize characteristics of the acoustic resonator 100 and the filter and perform any required frequency trimming. However, the first connection electrode 160a and the second connection electrode 160b are not limited thereto.

In such an acoustic resonator, according to one or more embodiments, configured as described above, excess resonance due to the lateral waves may be suppressed by the effects of the horizontal resonance suppressing part 140 on the acoustic resonator, such that noise and deterioration of performance of the acoustic resonator that are generated due to the lateral wave resonance may be significantly decreased.

Spurious resonance may result if lateral waves (or transverse mode standing waves) were generated in the resonance part 120, thereby distorting or deteriorating resonance performance of the resonance part 120.

Therefore, in order to significantly decrease the spurious resonance, the horizontal resonance suppressing part 140, according to one or more embodiments, may be formed to be vertically aligned with the inner wall of the frame 170, for example, to change physical properties of a boundary portion of the piezoelectric layer 123, corresponding to the edge of the active vibration region A, vertically aligned with the boundary between the upper electrode 125 and the frame 170, for example. Therefore, in accordance with one or more embodiments, amplitudes of the acoustic waves in the vertical direction may be different from each other between a central portion of the active vibration region A of the resonance part 120 where the horizontal resonance suppressing part 140 is not formed and an edge portion of the active vibration region A of the resonance part 120 where the horizontal resonance suppressing part 140 is formed.

Therefore, the central portion and the horizontal resonance suppressing part 140 will have different wave numbers in a transversal direction at a resonance frequency, such that overall vibration forms of the central portion and the horizontal resonance suppressing part 140 may be different from each other. For example, due to physical properties of the horizontal resonance suppressing part 140, an amplitude of acoustic waves in the vertical direction may be more rapidly changed in the horizontal resonance suppressing part 140 compared to the central portion. Therefore, with the changing of the physical properties of the piezoelectric layer 123 to form the horizontal resonance suppressing part 140, the amplitude change amount in the vertical direction depending on a horizontal distance between the active vibration region A and the horizontal resonance suppressing part 140 is changed, such that generation of resonance in the horizontal direction at a frequency lower than the resonance frequency of the acoustic resonator may be suppressed.

In addition, in the acoustic resonator 100, according to one or more embodiments, the frame 170 may be used to suppress vibrations generated in the active vibration region A from being leaked to the outside of a vibrating part, thereby increasing a quality (Q) factor of the acoustic resonator 100, and the horizontal resonance suppressing part 140 formed along the edge of the active vibration region A may be used to suppress resonance of horizontal vibrations. Therefore, the Q-factor and $k_t^2$ of the acoustic resonator 100 may be increased, and the lateral wave noise may be significantly decreased, compared to typical acoustic resonators that do not include such frames and horizontal resonance suppressing parts.

In addition, typical resonance parts of typical acoustic resonators without such a frame and/or horizontal resonance suppression part are typically formed as an oval shape or an atypical shape in order to decrease noise due to the lateral wave resonance. However, in an acoustic resonator according to one or more embodiments, noise due to such lateral wave resonance may be effectively suppressed by a horizontal resonance suppressing part, and thus, the resonance part according to one or more embodiments may also or alternatively be standardized in a quadrangular shape, or non-oval or non-atypical shape, depending on embodiment. For example, in an embodiment where a plurality of resonance parts, such as any of the resonance parts 120 described herein, are formed on the substrate, the resonance parts may be more efficiently disposed on the substrate, and an interval between the resonance parts may also be significantly decreased, using select quadrangular shapes compared to such oval or atypical shapes of the typical resonance parts. Therefore, a size of a module including the resonance parts may also be significantly decreased, as well as a mounting area of the resonance parts may be decreased, compared to typical resonance parts of typical acoustic resonators.

Figure 3:
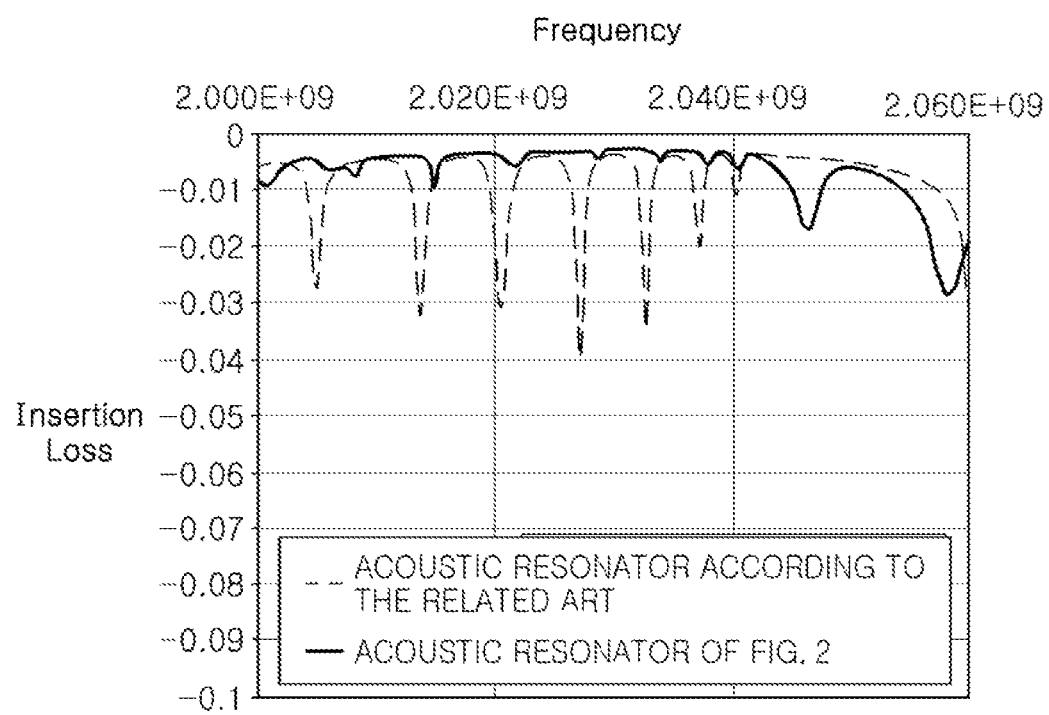
FIG. 3 is a graph comparing insertion losses of an example acoustic resonator and insertion losses of an example typical acoustic resonator.

FIG. 3 is a graph comparing insertion losses of an example acoustic resonator with a horizontal resonance suppressing part 140 having a configuration corresponding to the resonance part 120 of FIG. 2, and insertion losses of an example typical acoustic resonator without such a horizontal resonance suppressing part 140. Here, in this example, the piezoelectric layer 123 was formed of AlN, and the horizontal resonance suppressing part 140 was formed by injecting N ions into the piezoelectric layer 123.

Referring to FIG. 3, in the example typical acoustic resonator, a large amount of noise due to lateral wave resonance appears in a frequency band of 2.04 GHz or less. On the other hand, it may be appreciated that noise due to lateral wave resonance at the frequency band of 2.04 GHz or less is significantly decreased in the example acoustic resonator with the horizontal resonance suppressing part 140 and having the configuration corresponding to the resonance part 120 of FIG. 2, compared to the example typical acoustic resonator.

An acoustic resonator, according to one or more embodiments, may use an ion injection scheme for changing physical properties of the piezoelectric layer, and thus, the horizontal resonance suppressing part may be formed in a desired region, a desired shape, and with desired physical properties within the piezoelectric layer. Therefore, the corresponding horizontal resonance suppressing part may be formed in a determined optimal position and shape for a desired application and in differing embodiments regardless of a shape, a material, a size, and the like, of the acoustic resonator embodiment, and thus, effectively limit spurious resonance due to lateral waves, thereby improving resonance performance of the acoustic resonator.

Meanwhile, an acoustic resonator according to the present disclosure is not limited to the configurations discussed above, but may be variously modified.

Figure 4:
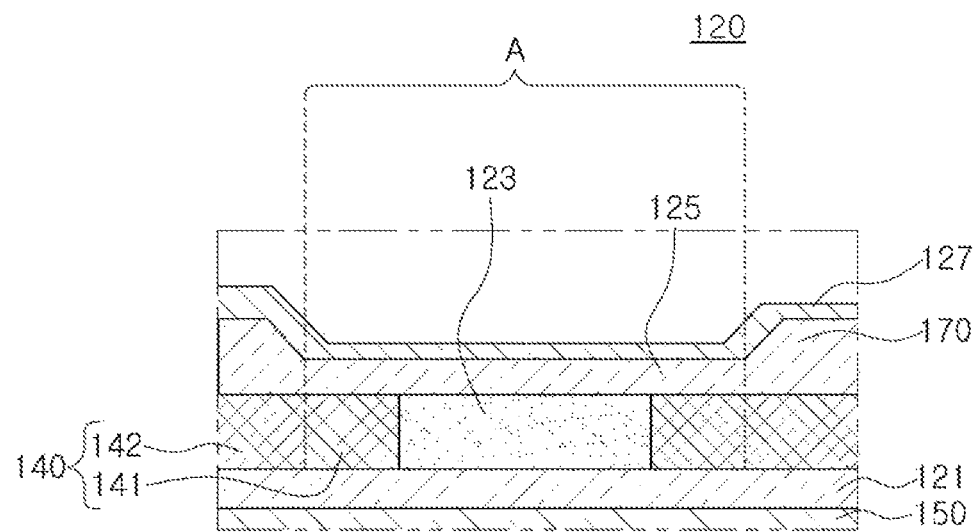
FIG. 4 is a cross-sectional view illustrating a resonance part of an acoustic resonator, according to one or more embodiments.
Figure 5:
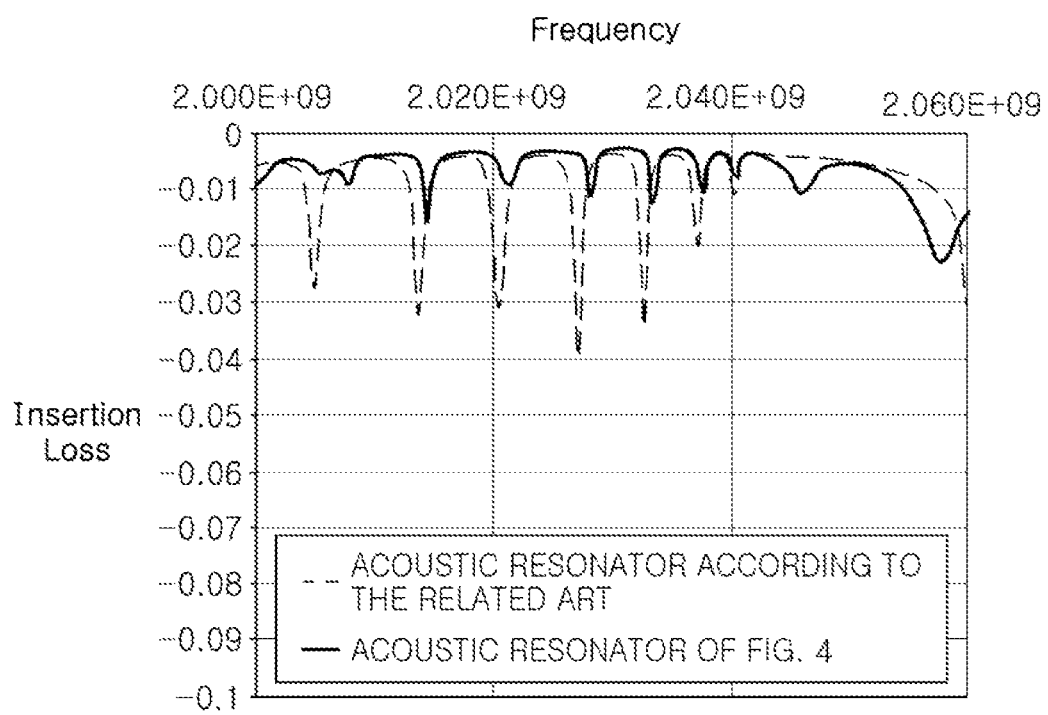
FIG. 5 is a graph comparing insertion losses of an example acoustic resonator and insertion losses of the example typical acoustic resonator.

For example, FIG. 4 is a cross-sectional view illustrating a resonance part of an acoustic resonator, according to one or more embodiments, and FIG. 5 is a graph comparing insertion losses of an example acoustic resonator having a configuration corresponding to the resonance part 120 of FIG. 4, and insertion losses of the example typical acoustic resonator discussed above with respect to FIG. 3.

Referring to FIGS. 4 and 5, the horizontal resonance suppressing part 140 may be formed to be thicker in the resonance part 120, according to one or more embodiments, than in the resonance part 120 configuration of FIG. 2, for example. For example, the horizontal resonance suppressing part 140 may be formed to have a thickness equal to half or less of the thickness of the piezoelectric layer 123 in the resonance part 120 configuration of FIG. 2, while the horizontal resonance suppressing part 140 in the resonance part 120 configuration of FIG. 4 may be formed at a thickness that is equal to half or more of the thickness of the piezoelectric layer 123. For example, in an embodiment, the horizontal resonance suppressing part 140 of FIG. 4 may be formed to have the same thickness as that of the piezoelectric layer 123.

It may be confirmed from FIG. 5 that insertion losses for an example acoustic resonator with such a resonance part 120 having the configuration of FIG. 4 become lower than the insertion losses of the example typical acoustic resonator. When comparing the illustrated insertion loss results of FIG. 5 with FIG. 3, it can also be seen that there may be a greater noise decreasing effect with the resonance part 120 configuration of FIG. 4 compared to the noise decreasing effect of the resonance part 120 configuration of FIG. 2.

Figure 6:
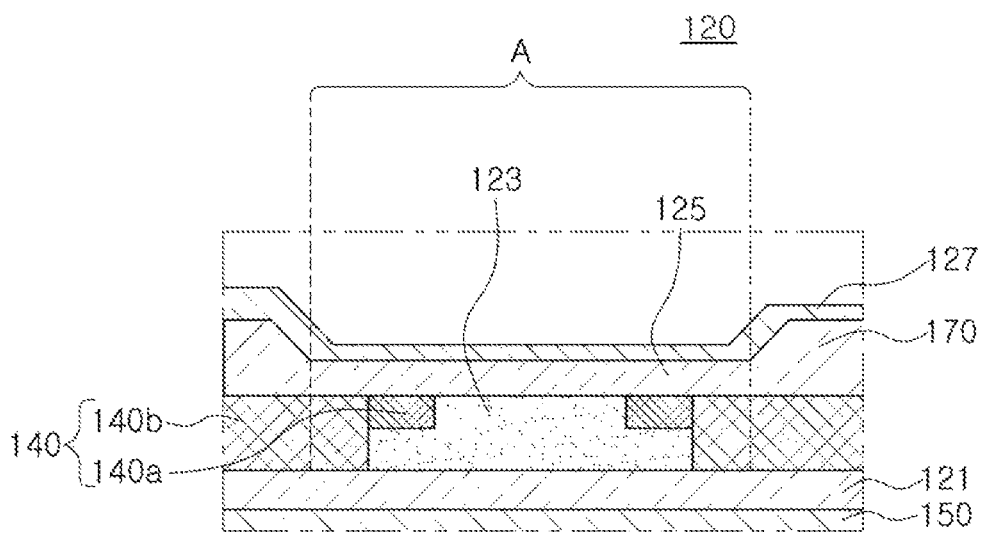
FIG. 6 is a cross-sectional view illustrating a resonance part of an acoustic resonator, according to one or more embodiments.

FIG. 6 is a cross-sectional view illustrating a resonance part of an example acoustic resonator, according to one or more embodiments. In addition, FIG. 7 is a graph comparing insertion losses of an acoustic resonator having a configuration corresponding to the resonance part 120 of FIG. 6, and the insertion losses of the example typical acoustic resonator discussed above with respect to FIGS. 3 and 5.

Figure 7:
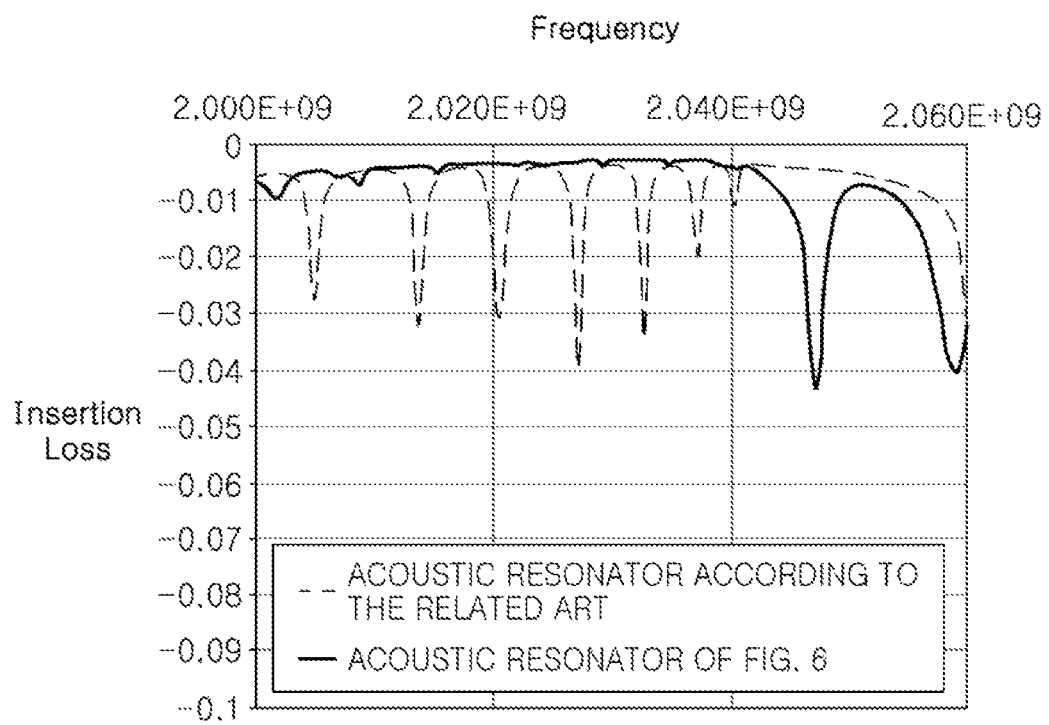
FIG. 7 is a graph comparing insertion losses of an example acoustic resonator and insertion losses of the example typical acoustic resonator.

Referring to FIGS. 6 and 7, an acoustic resonator according to one or more embodiments may include a first horizontal resonance suppressing part 140a disposed more toward the center of the active vibration region A than a second horizontal resonance suppressing part 140b in the active vibration region A, e.g., disposed outside of the first horizontal resonance suppressing part 140a and extending, depending on embodiment, beyond the active vibration region A into the inactive vibration region of the resonance part 120.

The first horizontal resonance suppressing part 140a may be thinner than that of the second horizontal resonance suppressing part 140b. For example, a thickness of the first horizontal resonance suppressing part 140a may be equal to half or less of a thickness of the second horizontal resonance suppressing part 140b or half or less of the thickness of the piezoelectric layer 123.

In the horizontal resonance suppressing part 140 illustrated in FIG. 6, a ratio between widths of the first horizontal resonance suppressing part 140a and the second horizontal resonance suppressing part 140b may be 3:2, as only an example, such that a width of the second horizontal resonance suppressing part 140b may be larger than that of the first horizontal resonance suppressing part 140a.

The first horizontal resonance suppressing part 140a and the portion of the second horizontal resonance suppressing part 140b disposed in the active vibration region A may be configured to have different widths. However, the widths of the first horizontal resonance suppressing part 140a and the portion of the second horizontal resonance suppressing part 140b disposed in the active vibration region A are not limited thereto, but may also be configured to have the same width, depending on application and embodiment. Alternatively, the first horizontal resonance suppressing part 140a and the second horizontal resonance suppressing part 140b may both have a same entire width.

As illustrated in FIG. 6, the horizontal resonance suppressing part 140 may be formed to have a step having a stair shape between the second horizontal resonance suppressing part 140b and the first horizontal resonance suppressing part 140a due to a thickness difference between the second horizontal resonance suppressing part 140b and the first horizontal resonance suppressing part 140a. Therefore, the horizontal resonance suppressing part 140 may be configured so that it becomes thicker from the central portion of the active vibration region A toward the edge of the active vibration region A. Though first and second horizontal resonance suppressing parts 140a, 140b have been discussed, additional horizontal resonance suppressing parts of the horizontal resonance suppressing part 140 may also be formed, e.g., providing more than two gradations of thickness from the least thick horizontal resonance suppressing part nearer the central portion to the thickest horizontal resonance suppressing part at and/or beyond the edge of the active vibration region A.

The first horizontal resonance suppressing part 140a and the second horizontal resonance suppressing part 140b may be formed through separate ion injection processes, respectively. For example, after the first horizontal resonance suppressing part 140a is formed in the piezoelectric layer 123 through a primary ion injection process, the second horizontal resonance suppressing part 140b may be formed through a secondary ion injection process.

The first horizontal resonance suppressing part 140a and the second horizontal resonance suppressing part 140b may be configured to have the same physical properties or different physical properties.

In the present example, both of the first horizontal resonance suppressing part 140a and the second horizontal resonance suppressing part 140b may be formed by injecting N ions into the piezoelectric layer 123 formed of AlN. Therefore, the first horizontal resonance suppressing part 140a and the second horizontal resonance suppressing part 140b may have the same physical properties.

However, the configuration according to the present disclosure is not limited thereto, but includes various modifications. For example, the first horizontal resonance suppressing part 140a may improve piezoelectric performance through ion replacement, and the second horizontal resonance suppressing part 140b may deteriorate piezoelectric performance by destroying a lattice structure, or vice versa.

In addition, though the first horizontal resonance suppressing part 140a and the second horizontal resonance suppressing part 140b may be formed at different thicknesses in the present example, embodiments are not limited thereto. That is, the first horizontal resonance suppressing part 140a and the second horizontal resonance suppressing part 140b may also be formed to have different physical properties and/or the same thickness. For example, with either of the configurations of the resonance part 120 of FIGS. 2 and 4, the illustrated first and second regions 141, 142 may be formed to have such example different physical properties or formed to have the same physical properties.

It may be confirmed from FIG. 7 that insertion losses of an example acoustic resonator having the configuration of FIG. 6 become smaller than the insertion losses of the example typical acoustic resonator discussed above with respect to FIGS. 3 and 5. In addition, referring to FIGS. 3 and 5, it can be seen that a noise decrease effect of the example acoustic resonator having the configuration of FIG. 6 is higher than the noise decrease effects of the example acoustic resonators having the respective configurations of FIGS. 2 and 4.

Figure 8:
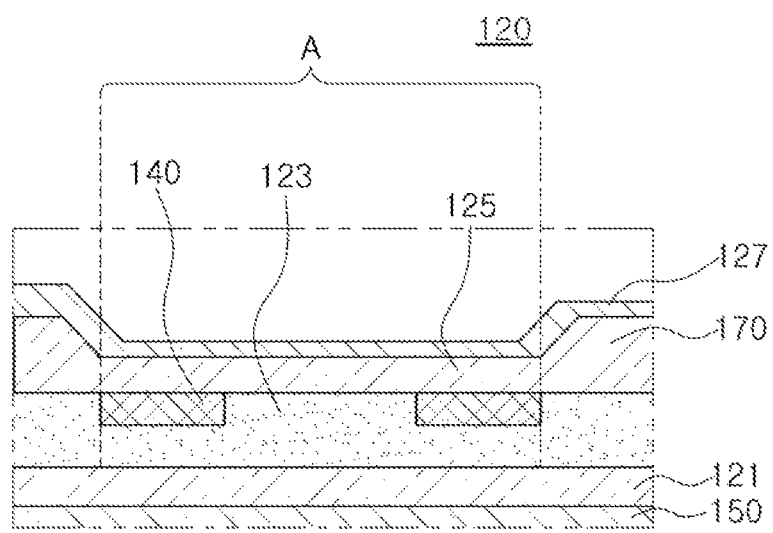
FIG. 8 is a cross-sectional view illustrating a resonance part of an acoustic resonator, according to one or more embodiments.

FIG. 8 is a cross-sectional view illustrating a resonance part of an acoustic resonator, according to one or more embodiments.

Referring to FIG. 8, in an acoustic resonator according to one or more embodiments, the horizontal resonance suppressing part 140 may be formed in only the active vibration region A, and may not be formed below or outside the frame 170. The horizontal resonance suppressing part 140 may be formed by changing physical properties of the piezoelectric layer 123, such to increase or decrease the piezoelectric effect of the resulting horizontal resonance suppressing part 140 compared to the remainder of the piezoelectric layer 123 in the active vibration region A where the horizontal resonance suppressing part 140 is not formed.

With the horizontal resonance suppressing part 140 of FIG. 8, lateral wave resonance may be mainly suppressed by the horizontal resonance suppressing part 140 disposed in the active vibration region A. Therefore, the horizontal resonance suppressing part 140 may be omitted outside the active vibration region A, depending on application and embodiment.

Figure 9:
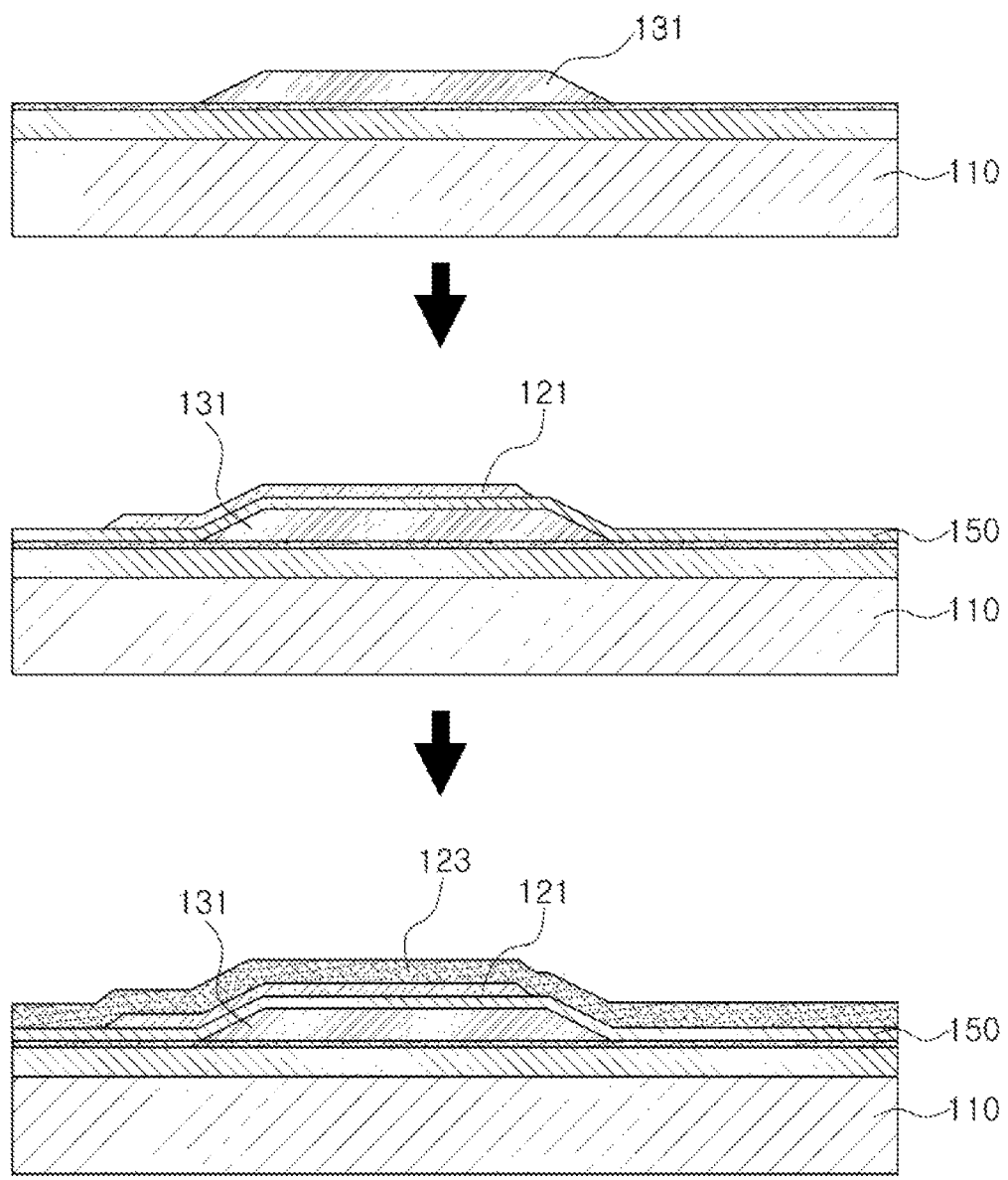
FIGS. 9 through 11 are views illustrating an acoustic resonator method, according to one or more embodiments.
Figure 10:
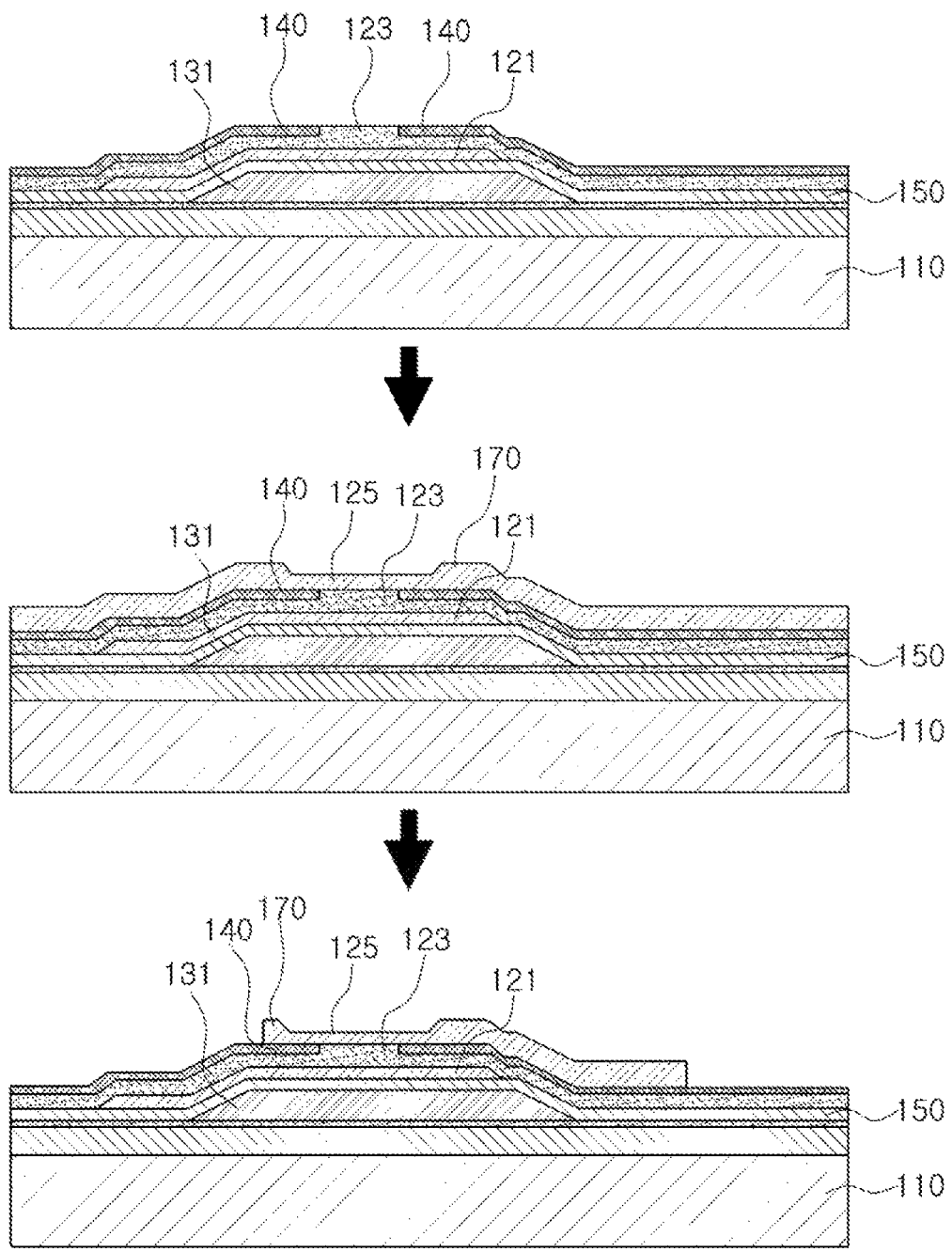
Figure 11:
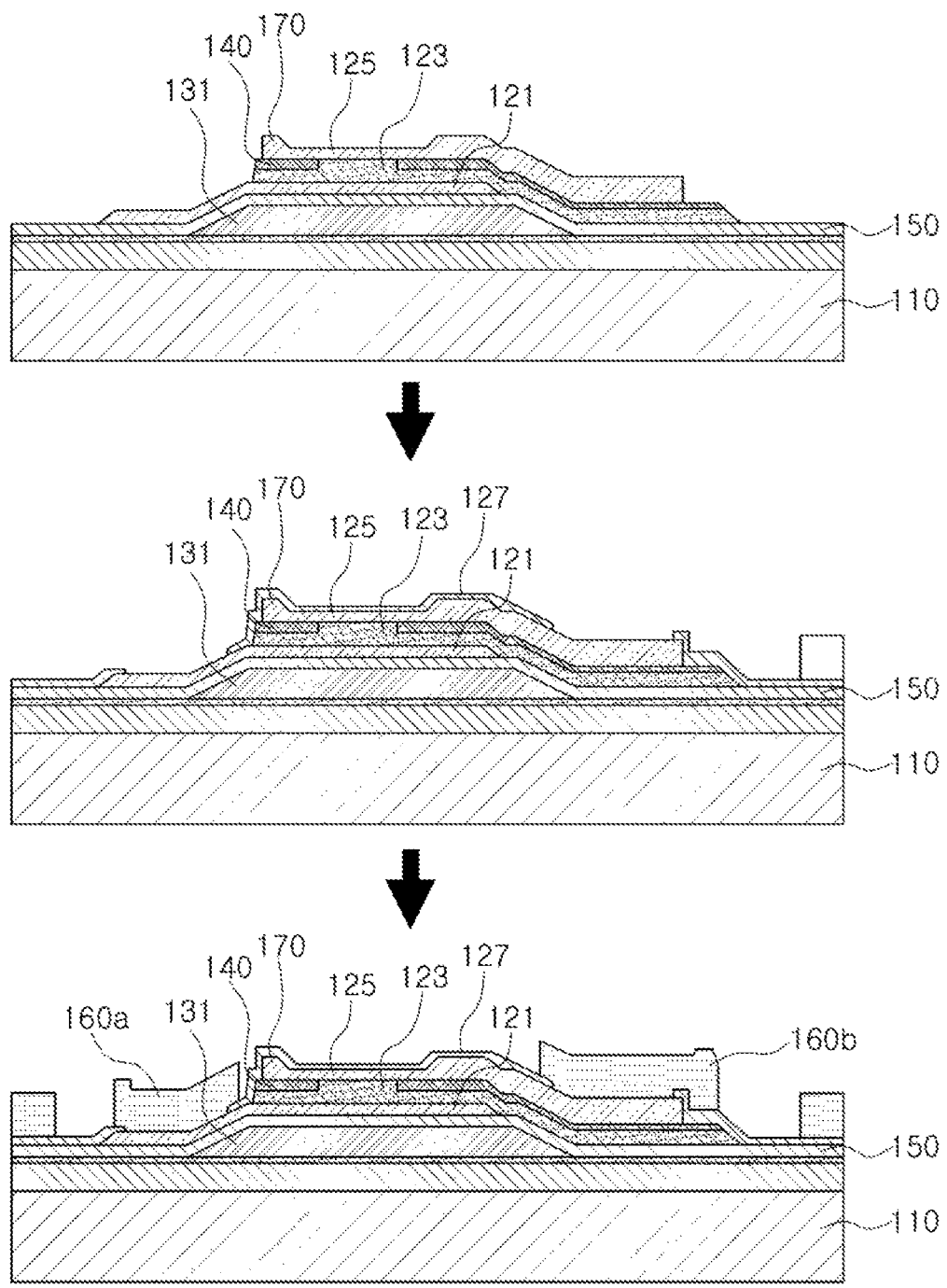

FIGS. 9 through 11 are views illustrating an acoustic resonator method, such as for the acoustic resonator 100 of FIG. 1 with the resonance part 120 configuration of FIG. 2, noting that discussions below are also applicable to the resonance part 120 configurations of FIGS. 4, 6, and 8, as only examples.

First, referring to FIG. 9, a sacrificial layer 131 may be formed on the substrate 110.

Figure 13:
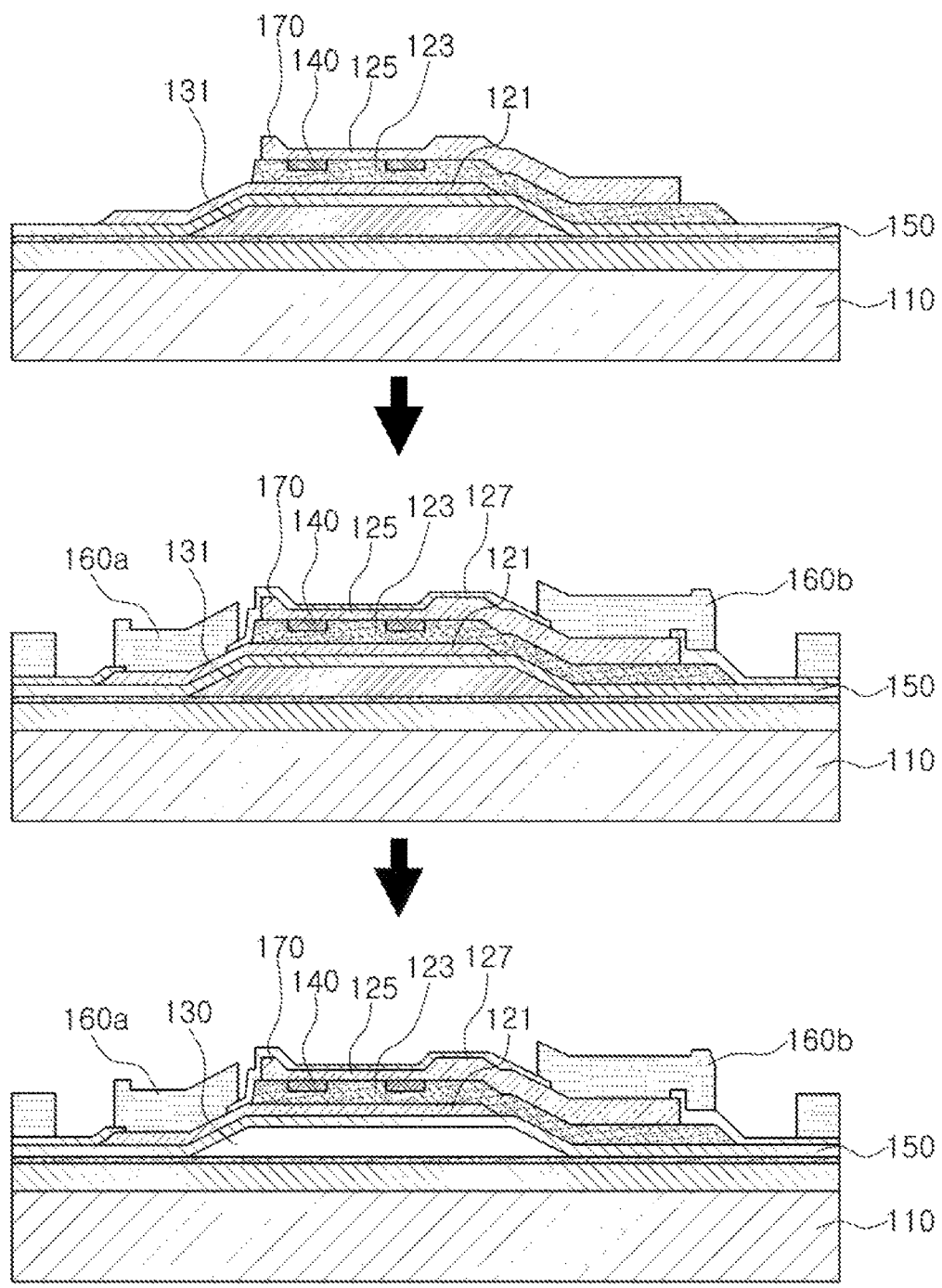

The substrate 110 may be a silicon substrate or a silicon-on-insulator (SOI) substrate, for example. In addition, the sacrificial layer 131 may be removed later, such as shown in FIG. 13, to form an air gap. The sacrificial layer 131 may be formed of a material such as polysilicon, polymer, or the like, as only examples.

Then, the membrane layer 150 may be formed on the substrate 110 and the sacrificial layer 131. The membrane layer 150 may serve to maintain a shape of the air gap, such as discussed above with regard to the air gap 130 of FIG. 1, and support a structure of the resonance part.

Then, the lower electrode 121 may be formed.

The lower electrode 121 may be formed by generally depositing a conductive layer on the substrate 110 and the sacrificial layer 131 and then removing (such as through patterning, as only an example, portions that are determined unnecessary for the desired acoustic resonator, for example. The present process may be performed by photolithograph, but is not limited thereto.

In an example, the conductive layer may be formed of molybdenum (Mo). However, the material of the conductive layer is not limited thereto. That is, various metals such as gold (Au), ruthenium (Ru), aluminum (Al), platinum (Pt), titanium (Ti), tungsten (W), palladium (Pd), chromium (Cr), nickel (Ni), or the like, as only examples, may be used as a material of the conductive layer.

Then, the piezoelectric layer 123 may be formed.

The piezoelectric layer 123 may be formed by depositing a piezoelectric material on the lower electrode 121.

In an example, the piezoelectric layer 123 may be formed of aluminum nitride (AlN). However, the material of the piezoelectric layer 123 is not limited thereto. That is, various piezoelectric materials such as zinc oxide (ZnO), quartz, and the like, as only examples, may be used as a material of the piezoelectric layer 123.

Then, as illustrated in FIG. 10, the horizontal resonance suppressing part 140 may be formed in the piezoelectric layer 123. The horizontal resonance suppressing part 140 may be formed by partially injecting ions into select regions or areas of the piezoelectric layer 123.

As described above, the horizontal resonance suppressing part 140 may be implemented at various depths and in various shapes depending on an ion source, energy, a dose of ions, a heat treatment temperature and time, or the like, as only examples.

For example, the horizontal resonance suppressing part 140 may be formed by forming the piezoelectric layer 123 using AlN and injecting ions of any one of Sc, Mg, Nb, Zr, and Hf, as only examples, into select regions or areas of the piezoelectric layer 123. In this case, for example, the piezoelectric performance of the horizontal resonance suppressing part 140 may be formed to be higher than the piezoelectric performance of other portions of the piezoelectric layer 123 in which these ions are not injected.

In addition, a horizontal resonance suppressing part 140 may also, or alternatively, be formed by intentionally destroying a lattice structure of the piezoelectric layer 123 by injecting ions of Ar, oxygen, B, P, N, or the like, as only examples, into the piezoelectric layer 123. In this case, piezoelectric performance of the horizontal resonance suppressing part 140 where the lattice structure is intentionally destroyed may be lower than other portions of the piezoelectric layer 123 in which these ions are not injected.

The horizontal resonance suppressing part 140 may be formed in both of an edge portion of an active vibration region A of the piezoelectric layer 123 of the resonance part, such as illustrated in FIG. 2, and a portion of the piezoelectric layer 123 outside of the active vibration region A. In this case, the horizontal resonance suppressing part 140 may be formed to a width that may ease manufacture of the horizontal resonance suppressing part 140. However, the resonator configuration is not limited thereto, and may include various modifications of the same based on the entire disclosure herein, as only examples. As another example, the horizontal resonance suppressing part 140 may be formed to have a small width, such as discussed further below with respect to FIGS. 12 and 13. As only an example, the horizontal resonance suppressing part 140 may be formed to have a width as small as possible.

Meanwhile, the forming of the horizontal resonance suppressing part 140 may include forming a first horizontal resonance suppressing part or region and a second horizontal resonance suppressing part or region, such as discussed above with respect to FIG. 2, 4, or 6.

In an example, the forming of the horizontal resonance suppressing part 140 may include forming the first and second horizontal resonance suppressing parts 140a, 140b discussed above with respect to FIG. 6, where the first and second horizontal resonance suppressing parts 140a, 140b have different thicknesses.

In this case, after the first horizontal resonance suppressing part 140a is formed in the piezoelectric layer 123 through a primary ion injection process, the second horizontal resonance suppressing part 140b may be formed through a secondary ion injection process, where the first ion injection process may be the same or different from the second ion injection process.

Alternatively, the second horizontal resonance suppressing part 140b may be formed at a thickness that is equal to half or more of the thickness of the piezoelectric layer 123, and the first horizontal resonance suppressing part 140a may be formed at a thickness that is thinner that of the second horizontal resonance suppressing part 140b, such as illustrated with the resonance part configuration of FIG. 6.

With this configuration, the horizontal resonance suppressing part 140 has a varying thickness that becomes thicker from the center of the active vibration region A toward the edge of the active vibration region A.

As illustrated in FIG. 10, when the horizontal resonance suppressing part 140 has been formed, the upper electrode 125 and the frame 170 may be formed on the piezoelectric layer 123, and then the upper electrode 125 may be patterned.

Then, as illustrated in FIG. 11, the piezoelectric layer 123 may be patterned, so as to remove some of the piezoelectric layer 123 beyond the active vibration region A, e.g., to expose a select portion of the lower electrode 121. Therefore, the active vibration region A, such as illustrated in FIG. 2, may be completed.

When the active vibration region A is completed, the protecting layer 127 may be formed, and then the first and second connection electrodes 160a and 160b may be formed. Then, the sacrificial layer 131 may be removed to complete the acoustic resonator. Here, the sacrificial layer 131 may be removed by an etching method, for example. The completed acoustic resonator may thus have a configuration corresponding to the acoustic resonator 100 of FIG. 1, as only an example.

Meanwhile, the acoustic resonator method according to one or more embodiments is not limited to the abovementioned descriptions, but rather the method and resultant configurations may be variously modified in differing embodiments based on all of the disclosures herein.

Figure 12:
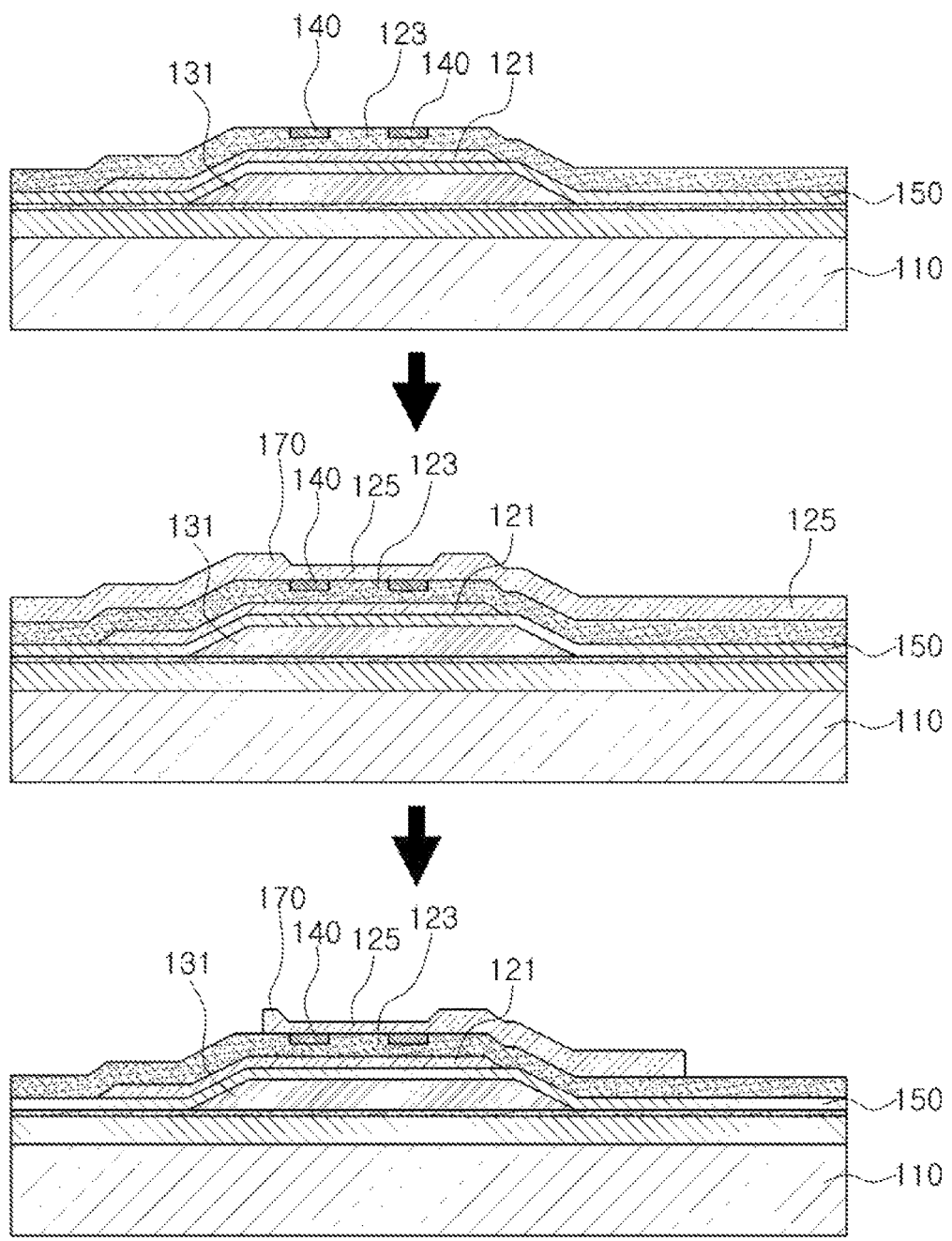
FIGS. 12 and 13 are views illustrating an acoustic resonator method, according to one or more embodiments.

For example, FIGS. 12 and 13 are views illustrating an acoustic resonator method, such for an acoustic resonator having a resonance part with the configuration of the resonance part 120 of FIG. 8, according to one or more embodiments.

First, the sequenced processes described above with respect to FIG. 9 may be performed.

Then, as illustrated in FIG. 12, the horizontal resonance suppressing part 140 may be formed in the piezoelectric layer 123. For example, the horizontal resonance suppressing part 140 may be formed by partially injecting ions into the piezoelectric layer 123.

Here, the horizontal resonance suppressing part 140 may be formed in only the active vibration region A of the piezoelectric layer 123, such as demonstrated with the resonance part 120 configuration of FIG. 8. In this case, a change in physical properties of the piezoelectric layer 123 may be to change the physical properties of a select regions or areas of the piezoelectric layer 123 corresponding to the horizontal resonance suppressing part 140 so the piezoelectric performance is significantly decreased in the horizontal resonance suppressing part 140. In this example, the width of the horizontal resonance suppressing part 140 may be minimized so that any change in piezoelectric performance of the piezoelectric layer 123, due to the horizontal resonance suppressing part 140, that is unnecessarily formed may be significantly decreased.

Then, the upper electrode 125 and the frame 170 may be formed on the piezoelectric layer 123, and the upper electrode 125 may be patterned.

Then, as illustrated in FIG. 13, the piezoelectric layer 123 may be patterned, then the protecting layer 127 formed, and then the first and second connection electrodes 160a and 160b formed. Then, the sacrificial layer 131 may be removed to complete the acoustic resonator.

As set forth above, in an acoustic resonator and method according to one or more embodiments, spurious resonance due to the lateral waves may be suppressed through a horizontal resonance suppressing part, such that noise and deterioration of performance of the acoustic resonator that are generated due to the lateral wave resonance may be significantly decreased compared to typical resonator approaches.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator comprising:
a substrate;
an active vibration region including, sequentially stacked on the substrate, a lower electrode, a piezoelectric layer, and an upper electrode; and
a horizontal resonance suppressing part formed from, and disposed in, the piezoelectric layer, the horizontal resonance suppressing part having piezoelectric physical properties that are different from piezoelectric physical properties of the piezoelectric layer,
wherein the horizontal resonance suppressing part is formed to have a thickness equal to half or less than half of a thickness of the piezoelectric layer.

2. The acoustic resonator of claim 1, wherein only a portion or an entirety of the horizontal resonance suppressing part is disposed in the active vibration region.

3. The acoustic resonator of claim 2, wherein a surface area of an upper surface of the horizontal resonance suppressing part disposed in the active vibration region is 50% or less than 50% of an entire surface area of an upper surface of the active vibration region.

4. The acoustic resonator of claim 2, wherein the horizontal resonance suppressing part is disposed along an edge of the active vibration region.

5. The acoustic resonator of claim 1, wherein the horizontal resonance suppressing part includes a first horizontal resonance suppressing part having a first thickness and a second horizontal resonance suppressing part having a different second thickness.

6. The acoustic resonator of claim 5, wherein the first horizontal resonance suppressing part and the second horizontal resonance suppressing part respectively include injected ions in piezoelectric material of the piezoelectric layer so that the first horizontal resonance suppressing part and the second horizontal resonance suppressing part have respective piezoelectric physical properties different from the piezoelectric physical properties of the piezoelectric layer.

7. The acoustic resonator of claim 5, wherein the first horizontal resonance suppressing part and the second horizontal resonance suppressing part are formed to have the same piezoelectric physical properties.

8. The acoustic resonator of claim 7, wherein the first horizontal resonance suppressing part and the second horizontal resonance suppressing part respectively include injected ions in piezoelectric material of the piezoelectric layer so that the first horizontal resonance suppressing part and the second horizontal resonance suppressing part have respective piezoelectric physical properties different from the piezoelectric physical properties of the piezoelectric layer.

9. The acoustic resonator of claim 1, wherein the horizontal resonance suppressing part is formed to have different thicknesses that increase in thickness toward an edge of the active vibration region.

10. The acoustic resonator of claim 9, wherein the horizontal resonance suppressing part includes injected ions in piezoelectric material of the piezoelectric layer so the piezoelectric physical properties of the horizontal resonance suppressing part are different from the piezoelectric physical properties of the piezoelectric layer.

11. The acoustic resonator of claim 1, wherein the horizontal resonance suppressing part is formed to have a same thickness as the piezoelectric layer.

12. The acoustic resonator of claim 11, wherein the horizontal resonance suppressing part includes injected ions in piezoelectric material of the piezoelectric layer so the piezoelectric physical properties of the horizontal resonance suppressing part are different from the piezoelectric physical properties of the piezoelectric layer.

13. The acoustic resonator of claim 1, wherein the horizontal resonance suppressing part includes injected ions in piezoelectric material of the piezoelectric layer so the piezoelectric physical properties of the horizontal resonance suppressing part are different from the piezoelectric physical properties of the piezoelectric layer.

14. The acoustic resonator of claim 1, wherein the horizontal resonance suppressing part is formed only within, and at an edge of, the active vibration region.

15. The acoustic resonator of claim 14, wherein the horizontal resonance suppressing part has a piezoelectric performance that is lower than a piezoelectric performance of the piezoelectric layer.

16. The acoustic resonator of claim 1, wherein the horizontal resonance suppressing part has a piezoelectric performance that is higher than a piezoelectric performance of the piezoelectric layer.

17. The acoustic resonator of claim 1, wherein the horizontal resonance suppressing part has a piezoelectric performance that is lower than a piezoelectric performance of the piezoelectric layer.

18. An acoustic resonator comprising:
a substrate;
a resonance unit, including:
a lower electrode;
a piezoelectric layer formed of piezoelectric material;
a horizontal resonance suppressing part formed of the piezoelectric material with injected ions; and
an upper electrode; and
an air gap below the resonance unit,
wherein the horizontal resonance suppressing part has piezoelectric physical properties different from piezoelectric physical properties of the piezoelectric layer, and
wherein the horizontal resonance suppressing part has a piezoelectric performance that is higher than a piezoelectric performance of the piezoelectric layer.

19. The acoustic resonator of claim 18, further comprising a frame having a ringed shape on the upper electrode and only outside of an active vibration region of the resonance unit.

20. The acoustic resonator of claim 18, wherein the horizontal resonance suppressing part has a ringed shape along an outer edge of the piezoelectric layer and at least partially within an active vibration region of the resonance unit.

21. The acoustic resonator of claim 18, wherein the injected ions include an ion of any one of Sc, Mg, Nb, Zr, Hf, Ar, 0, B, P, and N.

* * * * *